(12) United States Patent
Lee

(10) Patent No.: US 7,489,075 B2
(45) Date of Patent: Feb. 10, 2009

(54) DOUBLE-SIDED LIGHT EMITTING ORGANIC ELECTROLUMINESCENCE DISPLAY DEVICE HAVING A REFLECTION LAYER AND FABRICATION METHOD THEREOF

(75) Inventor: Kwan-Hee Lee, Suwon-si (KR)

(73) Assignee: Samsung Mobile Display Co., Ltd., Suwon (KR)

( * ) Notice: Subject to any disclaimer, the term of this patent is extended or adjusted under 35 U.S.C. 154(b) by 163 days.

(21) Appl. No.: 11/269,564

(22) Filed: Nov. 9, 2005

(65) Prior Publication Data

US 2006/0097631 A1   May 11, 2006

(30) Foreign Application Priority Data

Nov. 10, 2004   (KR) ............... 10-2004-0091561

(51) Int. Cl.
 *H01J 1/62* (2006.01)
 *H01J 63/04* (2006.01)

(52) U.S. Cl. .............. 313/506; 313/503; 313/509; 445/24

(58) Field of Classification Search ......... 313/498–512; 445/24
See application file for complete search history.

(56) References Cited

U.S. PATENT DOCUMENTS

| 6,356,032 | B1 * | 3/2002 | Suzuki et al. | 315/196.3 |
| 2001/0026123 | A1 * | 10/2001 | Yoneda | 313/504 |
| 2003/0151355 | A1 * | 8/2003 | Hosokawa | 313/504 |
| 2005/0040753 | A1 * | 2/2005 | Osame et al. | 313/500 |
| 2007/0210700 | A1 * | 9/2007 | Kato et al. | 313/504 |

FOREIGN PATENT DOCUMENTS

| JP | 2001004993 | 1/2001 |
| JP | 2003068472 | 3/2003 |
| JP | 2003223989 | 8/2003 |
| JP | 2004045771 | 2/2004 |
| KR | 1020030084336 | 11/2003 |

* cited by examiner

*Primary Examiner*—Toan Ton
*Assistant Examiner*—Bumsuk Won
(74) *Attorney, Agent, or Firm*—H.C. Park & Associates, PLC

(57) ABSTRACT

The present invention relates to a both-side light emitting organic EL display device including a reflection film having an opening and a first electrode formed on the reflection film and in the opening. An organic layer is formed on the first electrode, and a second electrode is formed on the organic layer. The opening corresponds to a central portion of the first electrode.

18 Claims, 4 Drawing Sheets

DOUBLE-SIDED LIGHT EMITTING ORGANIC ELECTROLUMINESCENCE DISPLAY DEVICE HAVING A REFLECTION LAYER AND FABRICATION METHOD THEREOF

CROSS REFERENCE TO RELATED APPLICATIONS

This application claims priority to and the benefit of Korean Patent Application No. 10-2004-0091561, filed on Nov. 10, 2004, which is hereby incorporated by reference for all purposes as if fully set forth herein.

BACKGROUND OF THE INVENTION

1. Field of the Invention

The present invention relates to a both-side light emitting organic electroluminescence display device, more particularly, to a both-side light emitting organic electroluminescence display device including a reflection film arranged under a first electrode.

2. Description of Related Art

Generally, an organic electroluminescence (EL) display device is a self-emissive flat panel display device that emits light by electrically exciting an organic compound. The organic EL display device may be fabricated at a low temperature, it has a high response speed of 1 ms or less, it has low power consumption, it has a wide viewing angle due to its self-emissive characteristics, and it has high contrast. It may be thin and lightweight since a backlight, which is used in other products such as a liquid crystal display (LCD) is not necessary, and it may be used in products such as cellular phones, etc. due to its uniform surface light emitting characteristics and fabrication convenience.

An organic EL display device includes an organic light-emitting layer between an anode and a cathode. Holes from the anode combine with electrons from a cathode in the organic light-emitting layer to form excitons, which are hole-electron pairs, and the organic light-emitting layer emits light when the excitons transition from an excited to ground state.

Generally, an organic EL display device may be a passive matrix or an active matrix device according to the method for driving N X M pixels arranged in a matrix. Passive matrix organic EL display devices are typically used for small, low resolution displays since a display region of the passive matrix device is constructed in a simple matrix of anodes and cathodes. On the other hand, an active matrix organic EL display device includes at least two thin film transistors per each pixel. Hence, the active matrix display is capable of exhibiting more stable luminance by supplying a constant electric current irrespective of the number of pixels, and it is typically used for large, high resolution displays due to its low power consumption.

Furthermore, organic EL display devices may be bottom light-emitting and top light-emitting devices according to the direction light is emitted from an organic light-emitting layer. The bottom light-emitting device emits light to the side of a substrate on which the device is formed, a reflection electrode is formed on an upper part of the organic light-emitting layer, and a transparent electrode is formed on a lower part of the organic light-emitting layer. An active matrix organic light-emitting device may have a reduced light emitting area since the area in each pixel where the thin film transistors are formed is a non-light emitting area. On the other hand, luminance of the top light-emitting organic EL display device is improved since its light transmission area may be increased by forming a transparent electrode on an upper part of an organic light-emitting layer and forming a reflection electrode on a lower part of the organic light-emitting layer, such that light emits in a direction opposite to the substrate. Currently, a both-side light emitting organic EL display device, which is capable of simultaneously realizing top light emission and bottom light emission on one substrate, is being noticed as a next generation flat panel display device.

FIG. 1 is a plan view of a conventional both-side light emitting organic EL display device.

Referring to FIG. 1, the conventional both-side light emitting organic EL display device includes a first transparent electrode 110 and a pixel defining layer 130 formed on the first electrode 110 to expose the first electrode. Light may be emitted to front and rear sides of the device from a part where the first electrode 110 is formed by sequentially forming an organic film layer, which includes at least an organic light-emitting layer, and a second transparent electrode on the first electrode 110.

The both-side light emitting organic EL display device and a fabrication method thereof are described in detail below with reference to FIG. 2 and FIG. 3.

FIG. 2 is a cross sectional view along line I-I' of FIG. 1 in a conventional both-side light emitting organic EL display device, and FIG. 3 is a cross sectional view for explaining a conventional both-side light emitting organic EL display device and a method for fabricating the conventional both-side light emitting organic EL display device.

Referring to FIG. 2, the first electrode 110 is patterned on a substrate 100 formed of glass or plastic. The first electrode 110 is a transparent electrode that may be formed of indium tin oxide (ITO) or indium zinc oxide (IZO), which have a high work function, when the first electrode 110 is an anode. When the first electrode 110 is a cathode, it may be formed as a transmission electrode formed of a material selected from the group consisting of Mg, Ca, Al, Ag and an alloy thereof as a conductive metal having a low work function.

A pixel defining layer 130 for partially exposing the surface of the first electrode may then be formed on the first electrode 110.

FIG. 3 is a cross sectional view of the conventional both-side light emitting organic EL display device of FIG. 2 in which an organic film layer and a second electrode are additionally formed on the exposed first electrode and the pixel defining layer.

Referring to FIG. 3, an organic film layer 140 including at least an organic light-emitting layer is formed on the exposed first electrode 10. In addition to the organic light-emitting layer, the organic film layer 140 may include one or more of the following layers: a hole injection layer, a hole transport layer, an electron transport layer and an electron injection layer.

Next, a second electrode 150 is formed on the organic film layer 140 over the entire substrate. The second electrode 150 may be a transmission electrode formed of a material selected from the group consisting of Mg, Ca, Al, Ag and an alloy thereof as a conductive metal having a low work function when the first electrode 10 is a transparent anode, and the second electrode 150 may be a transparent electrode formed of ITO or IZO when the first electrode 110 is a cathode.

A conventional both-side light emitting organic EL display device may emit light only from a part where the first electrode is formed. Hence, a small amount of the generated light may be emitted, and life of the device may be shortened accordingly since a part where the first electrode is formed may have a small area.

SUMMARY OF THE INVENTION

The present invention provides a both-side light emitting organic EL display device that increases the amount of light emitted by forming a portion of a first electrode on a reflection film.

Additional features of the invention will be set forth in the description which follows, and in part will be apparent from the description, or may be learned by practice of the invention.

The present invention discloses an organic EL display device including a substrate, a reflection layer arranged on the substrate and including an opening, a first electrode arranged on the reflection layer and in the opening, the opening corresponding to a central portion of the first electrode, a pixel defining layer for exposing a part of the first electrode, an organic layer arranged on the exposed part of the first electrode and comprising at least an organic light-emitting layer, and a second electrode arranged on the organic layer.

The present invention also provides a method for fabricating an organic EL display device including forming a reflection layer including an opening, forming a first electrode on the reflection layer and in the opening, which corresponds to a central portion of the first electrode, forming a pixel defining layer on the first electrode to expose a part of the first electrode, forming an organic layer, which includes at least an organic light-emitting layer, on the exposed part of the first electrode, and forming a second electrode on the organic layer.

The present invention also discloses an organic EL display device, including a substrate, a first electrode arranged on the substrate, a pixel defining layer arranged on the first electrode and exposing a part of the first electrode, an organic layer arranged on the exposed part of the first electrode and including at least an organic light-emitting layer, and a second electrode arranged on the organic layer. The organic EL display device emits light in a first direction substantially from along the exposed part of the first electrode and emits light in a second direction substantially from only a central portion of the first electrode. The central portion of the first electrode is smaller than the exposed part of the first electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
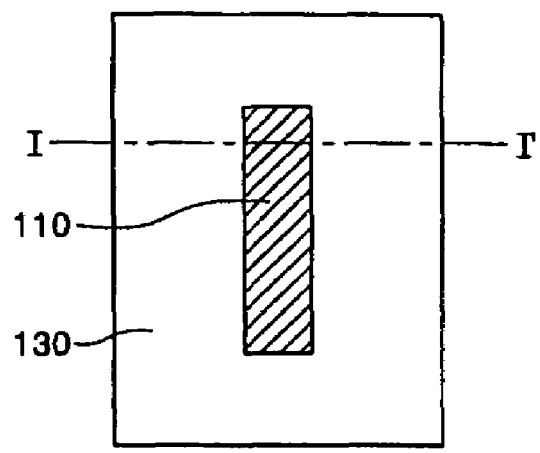
FIG. 1 is a plan view of a conventional both-side light emitting organic EL display device.
Figure 2:
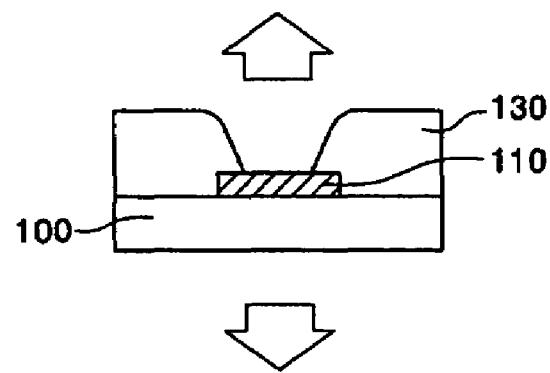
FIG. 2 is a cross sectional view along line I-I' of FIG. 1.
Figure 3:
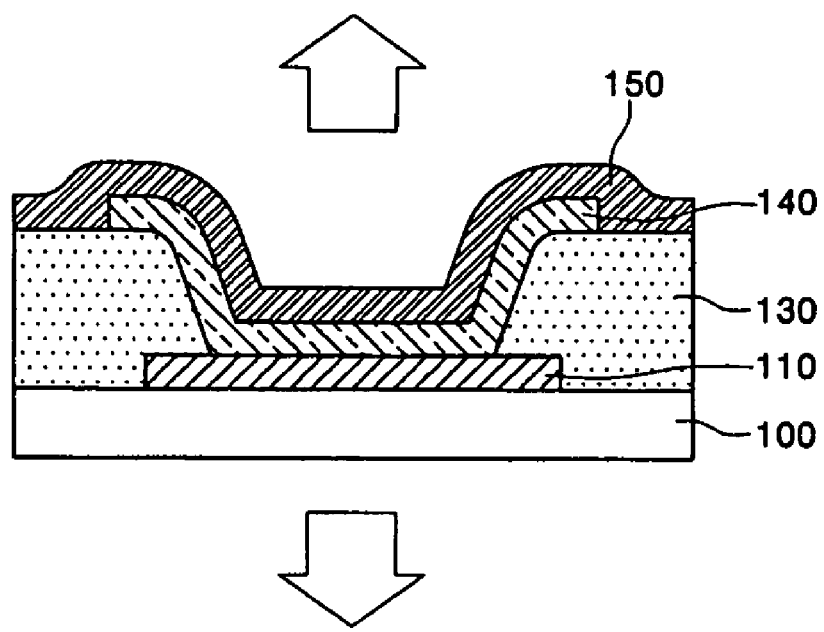
FIG. 3 is a cross sectional view for explaining a conventional both-side light emitting organic EL display device and a method for fabricating the conventional both-side light emitting organic EL display device.

The present invention will now be described in detail in connection with preferred embodiments with reference to the accompanying drawings. For reference, like reference characters designate corresponding parts throughout several views. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity.

It will be understood that when an element such as a layer, film, region or substrate is referred to as being "on" another element, it can be directly on the other element or intervening elements may also be present. In contrast, when an element is referred to as being "directly on" another element, there are no intervening elements present.

Figure 4:
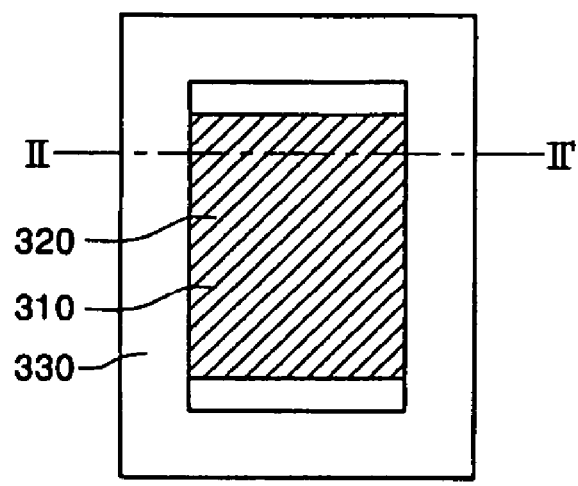
FIG. 4 is a plan view of a both-side light emitting organic EL display device according to a first exemplary embodiment of the present invention.

FIG. 4 is a plan view of a both-side light emitting organic EL display device according to an exemplary embodiment of the present invention.

Referring to FIG. 4, the both-side light emitting organic EL display device includes a reflection layer 310, a first electrode 320 formed on the reflection layer 310, and a pixel defining layer 330 formed on the first electrode 320 to expose a part of the first electrode 320.

A both-side light emitting organic EL display device and a method for fabricating the both-side light emitting organic EL display device are described below with reference to FIG. 5 and FIG. 6.

Figure 5:
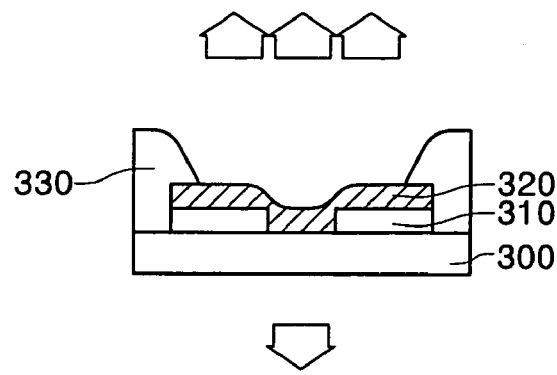
FIG. 5 is a cross sectional view along line II-II' of FIG. 4.
Figure 6:
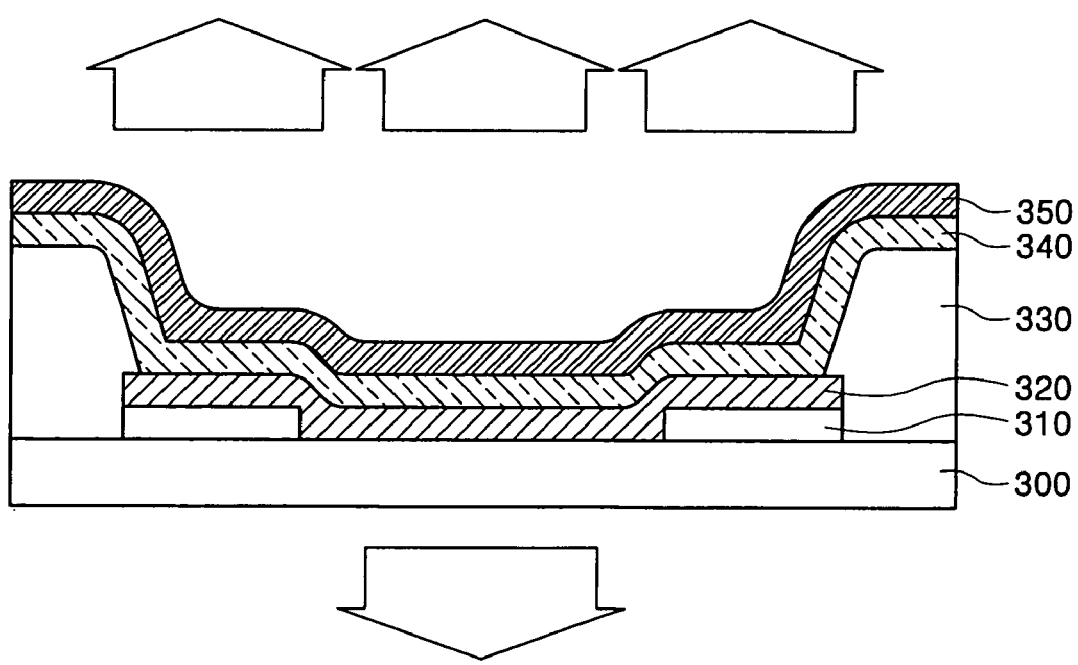
FIG. 6 is a cross sectional view for explaining a both-side light emitting organic EL display device according to the first exemplary embodiment of the present invention and a method for fabricating the both-side light emitting organic EL display device.

FIG. 5 is a cross sectional view along line II-II' of FIG. 4 in a both-side light emitting organic EL display device according to a first exemplary embodiment of the present invention, and FIG. 6 is a cross sectional view for explaining the both-side light emitting organic EL display device according to the first exemplary embodiment of the present invention and a method for fabricating the both-side light emitting organic EL display device.

Referring to FIG. 5, the both-side light emitting organic EL display device includes a reflection layer 310 formed by being patterned on a substrate 300, which may be made of glass or plastic, such that the reflection layer 310 includes an opening.

The reflection layer 310 may be formed of Al(Nd) or Ag, and is preferably formed of Al(Nd).

The reflection layer 310 may be about 50 to 100 nm thick. Its reflectivity is lowered if it is less than about 50 nm thick, and its process convenience deteriorates if it is thicker than about 100 nm.

Since the width of the reflection layer 310 may change according to resolution and distribution ratio of both-side lights, the width of the reflection layer 310 is not limited.

Further, the reflection layer 310 may be constructed so that a transmitting reflection layer and a reflective reflection layer are mixed in one pixel.

When the both-side light emitting organic EL display device is an active matrix device with a thin film transistor, each pixel basically includes a switching transistor, a driving transistor, a capacitor and an EL device. A source or drain electrode of the driving transistor is electrically coupled with the first electrode 320, thereby applying voltage to the first electrode 320, and the reflection layer 310 is formed such that it is spaced apart from the source/drain electrodes to prevent contact resistance.

The reflection layer 310 may be formed by various methods including sputtering and ion plating, but it is preferably formed by a sputtering method. The reflection layer 310 may be patterned using a mask through an etching process of selectively removing patterns of a photo resist (PR) layer formed in a photolithography process after deposition.

A first electrode 320 is formed on the reflection layer 310 and in the opening of the reflection layer 310. Here, the opening of the reflection layer 310 may correspond to a central portion of the first electrode 320. In this case, the reflection layer 310 is arranged along ends of the first electrode 320. When the first electrode 320 is an anode, it may be a transparent electrode formed of indium tin oxide (ITO) or indium zinc oxide (IZO) having a high work function. When the first electrode 320 is a cathode, it may be a transmission electrode formed of one of the following conductive materials: Mg, Ca, Al, Ag and an alloy thereof, which have a low work function.

The first electrode 320 may be about 50 Å to 300 Å thick. The first electrode 320 may not be consistently produced when it is less than about 50 Å thick, and an amount of emitted light may decrease, even though the first electrode 320 is equipped with the reflection layer 310, when the first electrode 320 is thicker than about 300 Å.

The first electrode 320 may be formed with the same method as the reflection layer 310. The first electrode 320 is formed on the reflection layer 310 to prevent galvanic corrosion, due to aluminum(Al) of the Al(Nd) used as the reflection layer 310, that may be caused by wet etching a subsequently deposited pixel defining layer.

A both-side light emitting organic EL display device that increases an amount of emitted light may be obtained by forming a first electrode 320 on the reflection layer 310 and in the opening of the reflective layer 310, thereby forming a top light emitting first electrode 320 including the reflection layer 310 to maximize an amount of emitted light at both ends of the first electrode 320 and forming a both-side light emitting first electrode 320 in the opening of the reflection layer 310.

Furthermore, the first electrode 320 including the reflection layer 310 may be formed in a stripe or delta (Δ) structure on the basis of the first electrode 320.

Next, a pixel defining layer 330 for exposing a part of the first electrode 320 is formed on the first electrode 320. The pixel defining layer 330 may be formed of polyimide (PI), polyamide (PA), acryl resin, benzo cyclo butene (BCB) and phenolic resin. The pixel defining layer 330 may be formed by a spin coating method.

Referring to FIG. 6, an organic layer 340, including at least an organic light-emitting layer, is formed on the exposed first electrode 320. In addition to the organic light-emitting layer, the organic layer 340 may further include one or more of the following layers: a hole injection layer, a hole transport layer, an electron transport layer and an electron injection layer.

Both small molecular weight material and high molecular weight material may be used as the organic light-emitting layer. The small molecular weight material may be aluminum quinolate (Alq3), anthracene, cyclopentadiene, BeBq2, Almq, ZnPBO, Balq, DPVBi, BSA-2 and 2PSP.

The high molecular weight material may be poly(p-phenylenevinylene) and its derivative, polythiophene and its derivative and polyphenylene and its derivative.

The hole injection layer may be formed of CuPc (copper phthalocyanine), PEDOT and m-MTDATA, the hole transport layer may be formed of aromatic tertiary amines including monoaryl amine, diaryl amine, triaryl amine and polymeric aryl amine, the electron transport layer may be formed of polycyclic hydrocarbon series derivative, heterocyclic compound and tris(8-quinolinolato)aluminum(Alq3), and the electron injection layer may be formed of materials including LiF, etc.

The organic layer 340 may be formed after performing deposition by vacuum evaporation, spin coating, inkjet printing, doctor blade coating and laser induced thermal imaging (LITI). On the other hand, the organic layer 340 may be formed by being patterned per respective unit pixels. The organic layer 340 may be patterned by LITI, vacuum evaporation using a shadow mask, and so on.

A second electrode 350 may then be formed on the organic layer 340. When the first electrode 320 is a transparent anode, the second electrode 350 may be a transmission electrode formed of Mg, Ca, Al, Ag and an alloy thereof, as a conductive metal having a low work function. On the other hand, when the first electrode 320 is a cathode, the second electrode 350 may be a transparent electrode formed of ITO or IZO.

The second electrode 350 is preferably formed of MgAg. The MgAg may be about 100 Å to 240 Å thick to maximize an amount of emitted light. When the MgAg is less than about 100 Å thick, the organic light-emitting layer may be damaged in a succeeding process, and when the MgAg is thicker than about 240 Å, the amount of emitted light may decrease. If more of the generated light is emitted, life of the device improves.

The second electrode 350 may be formed by a vacuum evaporation or sputtering method.

The both-side light emitting organic EL display device may be completed by coupling the substrate including the second electrode 350 with a sealing substrate.

Figure 7:
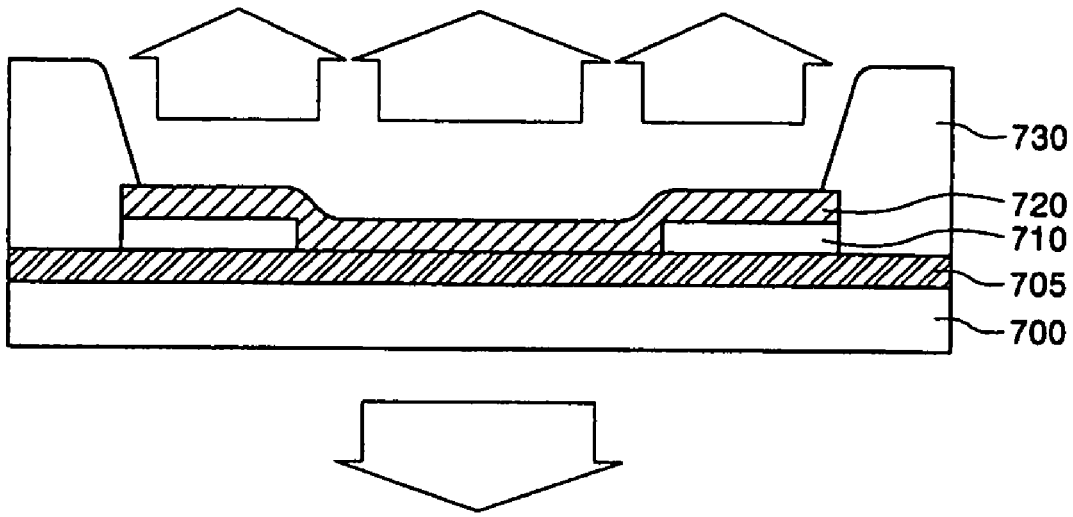
FIG. 7 is a cross sectional view along line II-II' of FIG. 4 in a both-side light emitting organic EL display device according to a second exemplary embodiment of the present invention.
Figure 8:
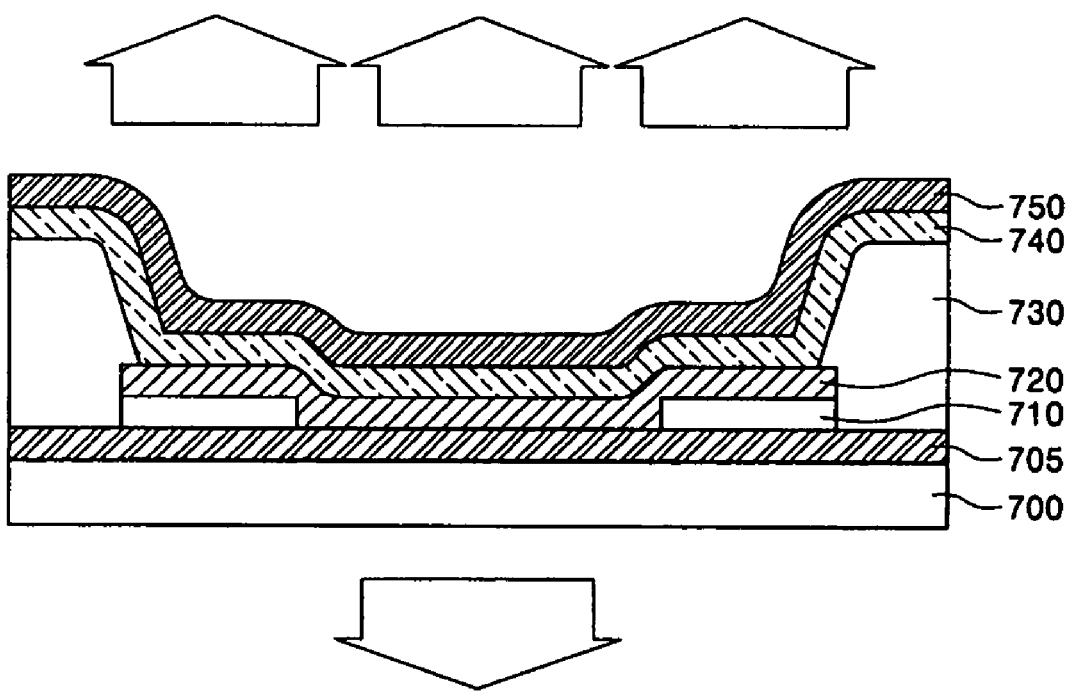
FIG. 8 is a cross sectional view for explaining a both-side light emitting organic EL display device according to the second exemplary embodiment of the present invention and a method for fabricating the both-side light emitting organic EL display device.

FIG. 7 is a cross sectional view along line II-II' of FIG. 4 in a both-side light emitting organic EL display device according to a second exemplary embodiment of the present invention, and FIG. 8 is a cross sectional view for explaining the both-side light emitting organic EL display device according to the second exemplary embodiment of the present invention and a method for fabricating the both-side light emitting organic EL display device.

Referring to FIG. 7, a transparent conductive film 705 may be formed on an entire surface of a substrate 700, which may be formed of glass or plastic. The transparent conductive film 705 may be formed of a transparent material such as ITO and IZO, but it is preferably formed of ITO. The transparent conductive film 705 may be deposited by a sputtering method.

The transparent conductive film 705 may prevent contact resistance with source/drain electrodes when the both-side light emitting organic EL display device is an active matrix device.

Aside from the transparent conductive film 705, the both-side light emitting organic EL display device, and its fabrication method, according to the second embodiment is the same as the both-side light emitting organic EL display device according to the first embodiment from a process of forming a reflection layer 710, a first electrode 720, a pixel defining layer 730, an organic layer 740, and a second electrode 750 on the transparent conductive film 705.

As described above, forming a transparent electrode on a reflection film and in an opening of the reflection film of a both-side light emitting organic EL display device according to exemplary embodiments of the present invention may provide a both-side light emitting organic EL display device with an increased amount of emitted light and improved lifespan.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic electroluminescence (EL) display device, comprising:
   a substrate;
   a reflection layer arranged on the substrate and including an opening;
   a first electrode arranged on the reflection layer and in the opening, the opening corresponding to a central portion of the first electrode;
   a pixel defining layer for exposing a part of the first electrode;
   an organic layer arranged on the exposed part of the first electrode and comprising at least an organic light-emitting layer; and
   a second electrode arranged on the organic layer,
   wherein the first electrode is a transparent electrode, and
   wherein the organic EL display device emits light in a first direction substantially along the exposed part of the first electrode and emits light in a second direction substantially from only the central portion of the first electrode, the central portion of the first electrode being smaller than the exposed part of the first electrode.

2. The organic EL display device of claim 1, wherein the first electrode comprises indium tin oxide.

3. The organic EL display device of claim 1, wherein the substrate comprises a thin film transistor, and the reflection layer is spaced apart from the source electrode and the drain electrode of the thin film transistor.

4. The organic EL display device of claim 3, wherein the reflection layer comprises Al(Nd) or Ag.

5. The organic EL display device of claim 3, wherein the reflection layer is about 50 nm to about 100 nm thick.

6. The organic EL display device of claim 1, wherein the first electrode is arranged in a stripe or delta ($\Delta$) structure.

7. The organic EL display device of claim 1, wherein the second electrode is a transparent electrode or a transmission electrode.

8. The organic EL display device of claim 7, wherein the transmission electrode comprises MgAg.

9. The organic EL display device of claim 8, wherein the MgAg is about 100 Å to about 240 Å thick.

10. The organic EL display device of claim 1, further comprising:
    a transparent conductive film arranged on the substrate, wherein the reflection layer is arranged on the transparent conductive film.

11. The organic EL display device of claim 10, wherein the transparent conductive film comprises indium tin oxide or indium zinc oxide.

12. The organic EL display device of claim 10, wherein the substrate comprises a thin film transistor, and the reflection layer is spaced apart from the source electrode and the drain electrode of the thin film transistor.

13. The organic EL display device of claim 12, wherein the reflection layer comprises Al(Nd) or Ag.

14. The organic EL display device of claim 10, wherein the first electrode is arranged in a stripe or delta ($\Delta$) structure.

15. The organic EL display device of claim 10, wherein the second electrode is a transparent electrode or a transmission electrode.

16. A method of fabricating an organic EL display device, comprising:
    forming a reflection layer including an opening on a substrate;
    forming a first electrode on the reflection layer and in the opening, the opening corresponding to a central portion of the first electrode;
    forming a pixel defining layer on the first electrode to expose a part of the first electrode; forming an organic layer on the exposed part of the first electrode, the organic layer comprising at least an organic light-emitting layer; and
    forming a second electrode on the organic layer,
    wherein the first electrode is a transparent electrode, and
    wherein the organic EL display device emits light in a first direction substantially along the exposed part of the first electrode and emits light in a second direction substantially from only the central portion of the first electrode, the central portion of the first electrode being smaller than the exposed part of the first electrode.

17. The method of claim 16, further comprising: forming a transparent conductive film on the substrate, wherein the reflection layer is formed on the transparent conductive film.

18. An organic EL display device, comprising:
    a substrate;
    a first electrode arranged on the substrate;
    a pixel defining layer arranged on the first electrode and exposing a part of the first electrode;
    an organic layer arranged on the exposed part of the first electrode and comprising at least an organic light-emitting layer; and
    a second electrode arranged on the organic layer,
    wherein the organic EL display device emits light in a first direction substantially along the exposed part of the first electrode and emits light in a second direction substantially from only a central portion of the first electrode, the central portion of the first electrode being smaller than the exposed part of the first electrode,
    and wherein the first electrode is a transparent electrode.

* * * * *